United States Patent
Dong et al.

(10) Patent No.: US 7,977,205 B2
(45) Date of Patent: Jul. 12, 2011

(54) METHOD OF FORMING ISOLATION LAYER OF SEMICONDUCTOR DEVICE

(75) Inventors: Cha Deok Dong, Icheon-si (KR); Whee Won Cho, Cheongju-si (KR); Jung Geun Kim, Seoul (KR); Cheol Mo Jeong, Icheon-si (KR); Suk Joong Kim, Icheon-si (KR); Jung Gu Lee, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/815,317

(22) Filed: Jun. 14, 2010

(65) Prior Publication Data

US 2010/0304549 A1  Dec. 2, 2010

Related U.S. Application Data

(62) Division of application No. 11/617,690, filed on Dec. 28, 2006, now Pat. No. 7,736,991.

(30) Foreign Application Priority Data

Oct. 31, 2006 (KR) ................................ 2006-106433

(51) Int. Cl.
  *H01L 21/76* (2006.01)
(52) U.S. Cl. ........ 438/427; 438/435; 438/431; 438/424; 438/E21.545
(58) Field of Classification Search .......... 438/424–433; 257/506–513
See application file for complete search history.

(56) References Cited

U.S. PATENT DOCUMENTS

| 6,140,207 | A | 10/2000 | Lee |
| 6,207,532 | B1 | 3/2001 | Lin et al. |
| 6,214,696 | B1 | 4/2001 | Wu |
| 2005/0139865 | A1* | 6/2005 | Choi ........................... 257/204 |

FOREIGN PATENT DOCUMENTS

| CN | 1455445 | 11/2003 |
| CN | 1832146 | 9/2006 |
| JP | 2002-319638 A | 10/2002 |
| KR | 1019980068057 A | 10/1998 |
| KR | 1020010036818 A | 5/2001 |
| KR | 1020030012116 A | 2/2003 |
| KR | 1020040053441 A | 6/2004 |
| KR | 1020050011487 A | 1/2005 |
| KR | 1020050028618 A | 3/2005 |
| KR | 10-2005-0069427 A | 7/2005 |
| KR | 1020050078897 A | 8/2005 |
| KR | 10-2005-0111416 A | 11/2005 |
| KR | 1020060074078 A | 7/2006 |

* cited by examiner

*Primary Examiner* — Dung A Le
(74) *Attorney, Agent, or Firm* — Kilpatrick Townsend & Stockton LLP (57) ABSTRACT

A method of forming an isolation layer of a semiconductor device includes forming first trenches in an isolation region of a semiconductor substrate. Sidewalls and a bottom surface of each of the first trenches are oxidized by a radical oxidization process to form a first oxide layer. An oxidization-prevention spacer is formed on the sidewalls of each of the first trenches. Second trenches are formed in the isolation region below the corresponding first trenches, wherein each second trench is narrower and deeper than the corresponding first trench. The second trenches are filled with a second oxide layer. The first trenches are filled with an insulating layer.

16 Claims, 6 Drawing Sheets

METHOD OF FORMING ISOLATION LAYER OF SEMICONDUCTOR DEVICE

The present application is a divisional of U.S. patent application Ser. No. 11/617,690, filed on Dec. 28, 2006, which claims priority to Korean patent application number 10-2006-106433, filed on Oct. 31, 2006, both of which are incorporated herein by reference in their entirety.

BACKGROUND OF THE INVENTION

The present invention relates to semiconductor devices and, more particularly, to a method of forming an isolation layer of a semiconductor device employing a Shallow Trench Isolation (STI) process.

In the process of manufacturing semiconductor devices, an isolation layer is formed in order to electrically insulate semiconductor devices (such as transistors) formed over a substrate. Conventionally, the isolation layer was formed by a LOCOS process of a local oxidation method. As the level of integration of devices has increased, the isolation layer is currently formed by a STI process.

The STI process is performed such that an isolation region of a semiconductor substrate is etched to form trenches. The trenches are filled with an insulating material. The STI process for manufacturing semiconductor devices overcomes the occurrence of a bird's beak in the LOCOS process. However, as the level of integration of devices increases, the width of each trench decreases. This makes it difficult to fill the trenches with insulating material.

BRIEF SUMMARY OF THE INVENTION

One of embodiments of the present invention is directed to a method of forming an isolation layer of a semiconductor device. A void is formed within a trench at a location lower than a substrate surface. The void does not affect subsequent processes, and an isolation layer may be easily formed in a trench having a narrow width.

In one embodiment, a method of forming an isolation layer of a semiconductor device includes forming first trenches in an isolation region of a semiconductor substrate. A spacer is formed on sidewalls of each of the first trenches. Second trenches are formed in the isolation region within the spacers. Each second trench is narrower and deeper than the corresponding first trench. A first oxide layer is formed on sidewalls and a bottom surface of each of the second trenches. The first trenches are filled with an insulating layer.

In another embodiment, a method of forming an isolation layer of a semiconductor device includes forming a tunnel insulating layer, an electronic storage layer and an isolation mask over a semiconductor substrate. The isolation mask, the electronic storage layer, the tunnel insulating layer and the semiconductor substrate of an isolation region are etched to form first trenches. Spacers are formed on sidewalls of the first trenches, the electronic storage layer and the isolation mask. Second trenches are formed in the isolation region within the spacers. Each second trench is narrower and deeper than the corresponding first trench. A first oxide layer is formed on sidewalls and a bottom surface of each of the second trenches. The first trenches are filled with an insulating layer so that a void is formed in each of the second trenches.

In still another embodiment, a method of forming an isolation layer of a semiconductor device includes forming first trenches in an isolation region of a semiconductor substrate. Sidewalls and a bottom surface of each of the first trenches is oxidized by a radical oxidization process to form a first oxide layer An oxidization-prevention spacer is formed on the sidewalls of each of the first trenches. Second trenches are formed in the isolation region with the oxidization-prevention spacers. Each second trench is narrower and deeper than the corresponding first trench. The second trenches are filled with a second oxide layer. The first trenches are filled with an insulating layer.

In a further embodiment, a method of forming an isolation layer of a semiconductor device includes forming a tunnel insulating layer, an electronic storage layer and an isolation mask over a semiconductor substrate. The isolation mask, the electronic storage layer, the tunnel insulating layer and the semiconductor substrate of an isolation region are etched to form first trenches. Sidewalls and a bottom surface of each of the first trenches is oxidized by a radical oxidization process to form a first oxide layer. Oxidization-prevention spacers are formed on the sidewalls of the first trenches, the electronic storage layer and the isolation mask. Second trenches are formed in the isolation region within the oxidization-prevention spacers. Each second trench is narrower and deeper than the corresponding first trench. The second trenches are filled with a second oxide layer. The first trenches are filled with an insulating layer.

DESCRIPTION OF SPECIFIC EMBODIMENTS

The present invention will be described in connection with specific embodiments with reference to the accompanying drawings. FIGS. 1A to 1H are cross-sectional views illustrating a method of forming an isolation layer of a semiconductor device according to an embodiment of the present invention.

Figure 1A:
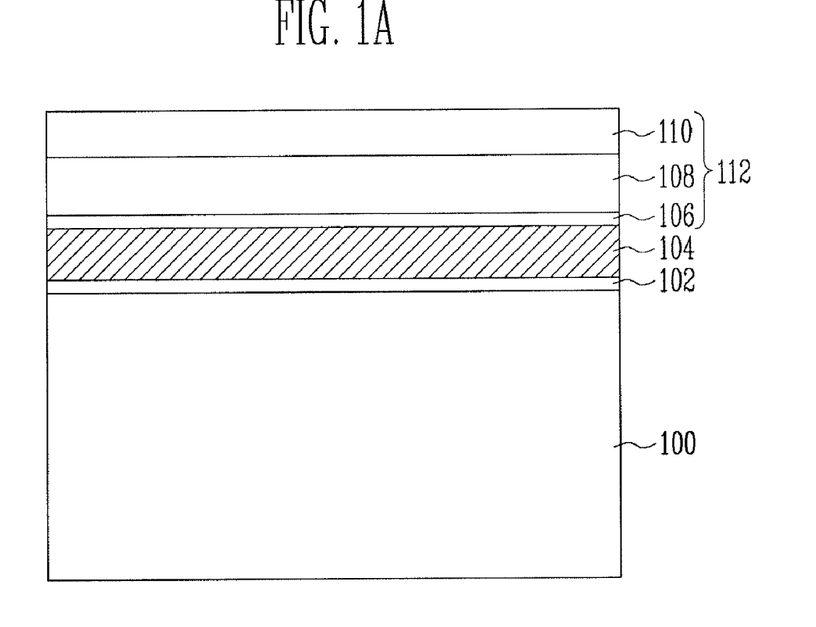
FIGS. 1A to 1H are cross-sectional views illustrating a method of forming an isolation layer of a semiconductor device according to an embodiment of the present invention.

Referring to FIG. 1A, a tunnel insulating layer 102, an electronic storage layer 104 and an isolation mask 112 are sequentially formed over a semiconductor substrate 100. The isolation mask 112 may comprise a stack of a buffer oxide layer 106, a nitride layer 108 and a hard mask 110. The hard mask 110 may be formed using nitride, oxide, SiON or amorphous carbon. The electronic storage layer 104 forms a floating gate of a flash memory device. The electronic storage layer 104 may be formed using polysilicon or a silicon nitride layer. Alternatively, the electronic storage layer 104 may be formed using any material capable of storing electrons.

Figure 1B:
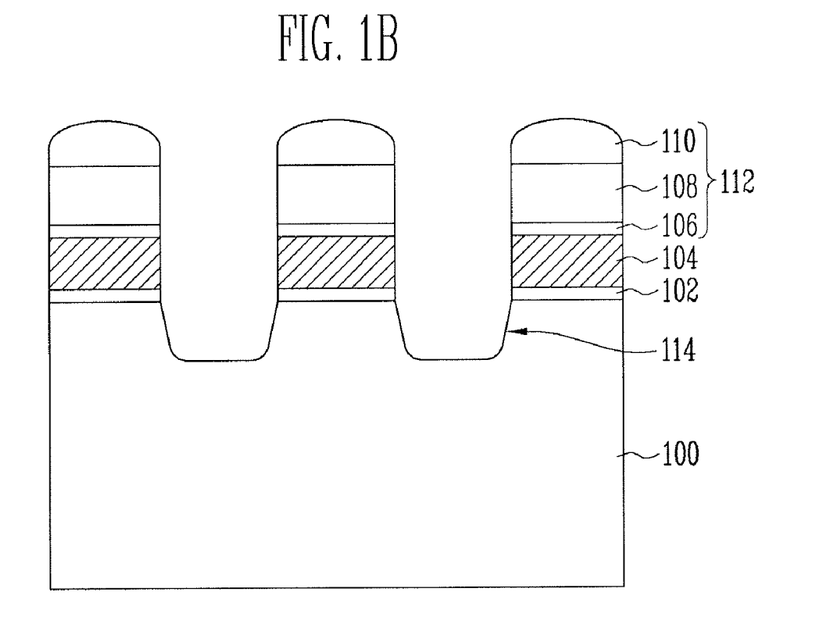

Referring to FIG. 1B, the isolation mask 112, the electronic storage layer 104 and the tunnel insulating layer 102 of the isolation region are sequentially etched to expose the isolation region of the semiconductor substrate 100. This is described below in detail.

A photoresist (not shown) is coated on the isolation mask 112. Exposure and development processes are performed to form a photoresist pattern (not shown) through which the isolation mask 112 of the isolation region is exposed. The isolation region of the isolation mask 112 is etched by an etch process employing the photoresist pattern. The photoresist pattern is then removed.

The electronic storage layer 104 and the tunnel insulating layer 102 are etched by an etch process employing the isolation mask 112. Accordingly, the semiconductor substrate 100 of the isolation region is exposed. In the process of etching the nitride layer 108, the buffer oxide layer 106, the electronic storage layer 104 and the tunnel insulating layer 102, the hard mask 110 is also etched to a specific thickness.

The exposed semiconductor substrate 100 of the isolation region is etched by a first etch process to form first trenches 114. The first trenches 114 are formed at a depth corresponding to approximately ⅙ to approximately ⅓ of a total target depth. For example, the first trenches 114 may be formed by etching the semiconductor substrate to a thickness of approximately 50 to approximately 2000 angstroms. The first etch process may be performed on sidewalls of the first trenches 114 so that the sidewalls are formed at an angle of approximately 85 to 90 degrees relative to a bottom surface of the first trenches 114.

Figure 1C:
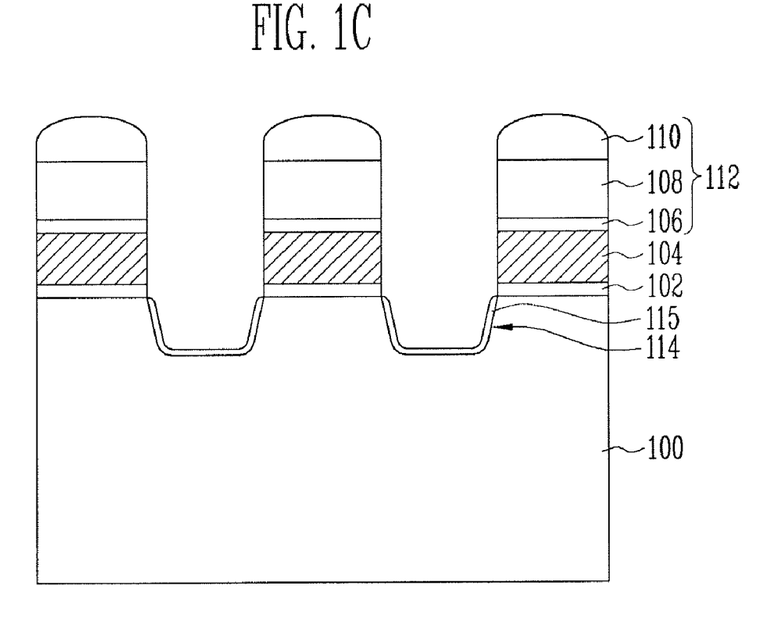

Referring to FIG. 1C, in order to repair etch damage generated on the sidewalls and the bottom surfaces of the first trenches 114 during the etch process, an oxidization process may be performed. The oxidization process is preferably performed so that the sidewalls and the bottom surfaces of the first trenches 114 are oxidized at a range of approximately 20 to approximately 100 angstroms. The sidewalls and the bottom surfaces of the first trenches 114 are oxidized to form a first oxide layer 115 on the etch damaged layer.

The oxidization process may be performed by a general thermal oxidization method, such as a radical oxidization method. In a general thermal oxidization method, when forming the first oxide layer 115, a bird's beak may occur in which the exposed edges of the tunnel insulating layer 102 thicken while being re-oxidized. Accordingly, in order to prohibit the occurrence of the bird's beak, the oxidization process is preferably performed by the radical oxidization method.

The oxidization process causes the sidewalls and the bottom surfaces of the first trenches 114, and the surfaces of the electronic storage layer 104 and the isolation mask 112 to be oxidized to a specific thickness. The first oxide layer 115 is formed on the entire surface, and a relatively large amount of the silicon component is distributed on the sidewalls and the bottom surfaces of the first trenches 114. Thus, the first oxide layer 115 is formed with a large thickness on the sidewalls and the bottom surfaces of the first trenches 114.

Figure 1D:
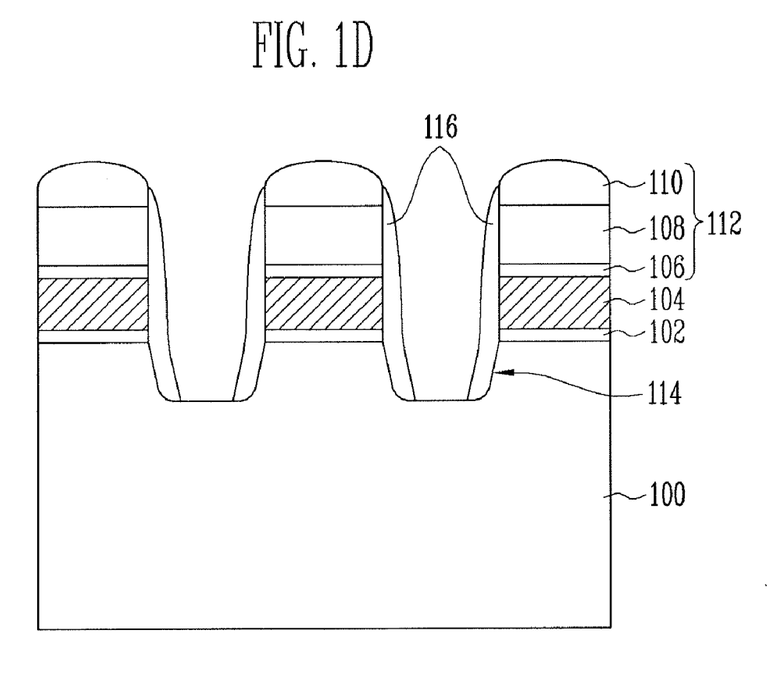

Referring to FIG. 1D, a spacer 116 is formed on the sidewalls of the first trenches 114. An insulating layer (not shown) is formed on the entire surface of the first trenches 114. A blanket etch-back process is performed such that the insulating layer remains on the sidewalls of the first trenches 114 and the insulating layer is removed from the bottom surfaces of the first trenches 114, thereby forming the spacer 116. The insulating layer remains on the sidewalls of the electronic storage layer 104 and the isolation mask 112. Therefore, the spacer 116 is formed on the sidewalls of the first trenches 114, the electronic storage layer 104 and the isolation mask 112.

The insulating layer may be formed by an oxidization process using an oxide layer, a HTO oxide layer, a nitride layer or a combination thereof. When the spacer 116 is formed with an oxidization-prevention layer, it is preferred that the spacer 116 includes nitride. An example in which the spacer 116 is formed with the oxidization-prevention layer is described below.

The spacer 116 is preferably formed with a thickness such that the bottom surfaces of the first trenches 114 may be exposed between the spacers 116. The spacers 116 may be formed with a thickness corresponding to approximately ⅙ to approximately ¼ of the width of the first trenches 114, or to a thickness of approximately 50 to approximately 1000 angstroms.

Figure 1E:
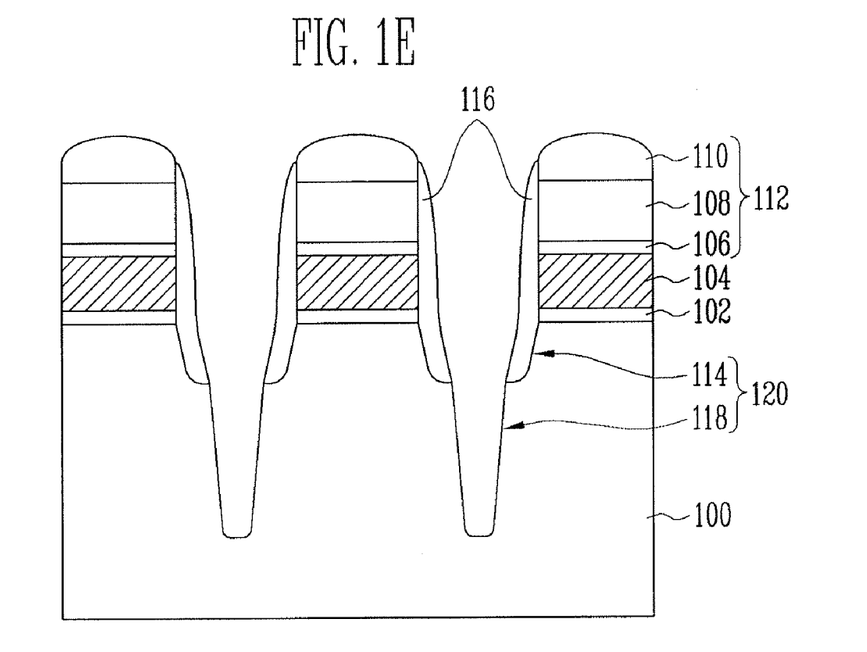

Referring to FIG. 1E, the semiconductor substrate 100 that is exposed between the spacers 116 at the bottom of the first trenches 114 is etched by an etch process employing the spacers 116 and the isolation mask 112 to form second trenches 118. The second trenches 118 may be formed at a depth of approximately 500 to approximately 20000 angstroms. Thus, a trench 120 having an upper portion that is wider than a lower portion is formed in the isolation region.

Figure 1F:
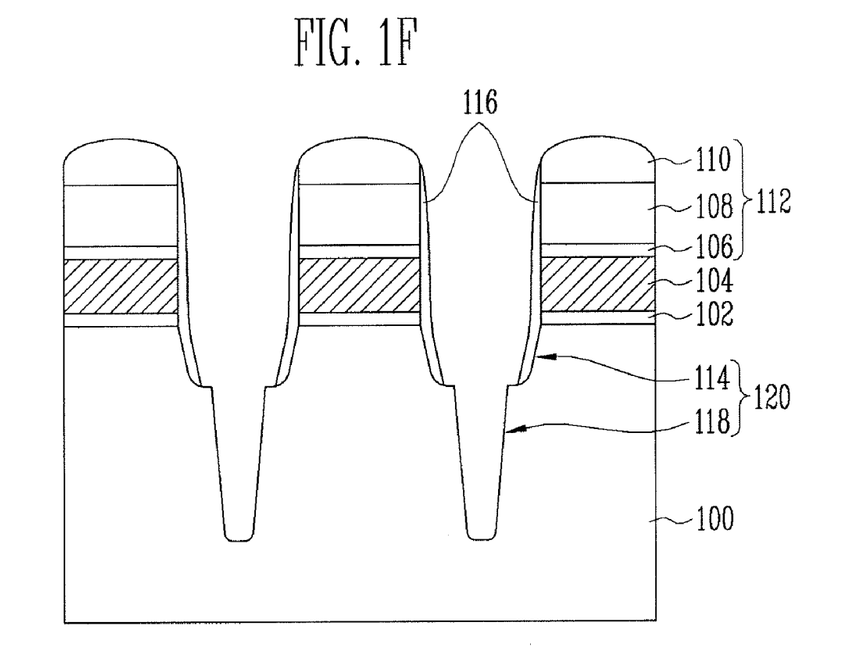

Referring to FIG. 1F, the spacer 116 is etched to a specific thickness so that the distance between opposite sides of the spacers 116 is widened. Alternatively, the spacers 116 may be completely removed. When the spacer 116 is formed of oxide, it may be etched using a fluorine solution. When the spacer 116 is formed of nitride, it may be etched using a phosphoric acid solution.

If the distance between opposite sides of the spacers 116 is widened, the aspect ratio reduces, and a gap-full characteristic may be improved when the insulating layer for filling the trench 120 is formed in a subsequent process. The etch process of the spacer 116 may be performed using a wet etch or a dry etch process employing an etchant.

Figure 1G:
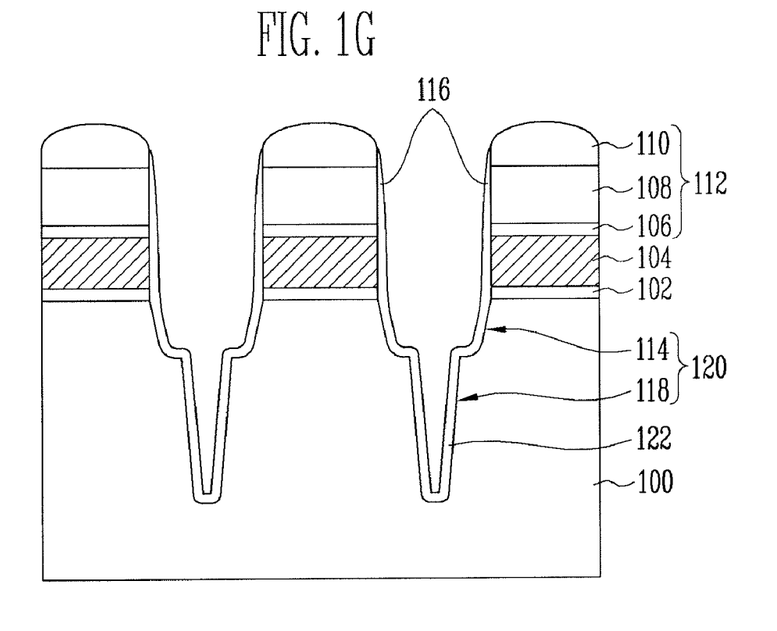

Referring to FIG. 1G, in order to repair etch damage which may occur on sidewalls and bottom surfaces of the second trenches 118, an oxidization process may be performed. The oxidization process may be performed using a dry oxidization process or a radical oxidation process. In one embodiment, the oxidization process is preferably performed using the radical oxidization process rather than the dry oxidization process. The radical oxidization process prevents the occurrence of the bird's beak in which the edges of the tunnel insulating layer 102 thicken during the oxidization process.

The sidewalls and the bottom surfaces of the second trenches 118 are oxidized to a specific thickness by means of the oxidization process, so that a second oxide layer 122 is formed over the etch damage layer. The second oxide layer 122 may be formed to a thickness of approximately 10 to approximately 300 angstroms. Thus, the sidewalls and the bottom surfaces of the trenches 120 are covered with the spacer 116 and the second oxide layer 122.

Figure 1H:
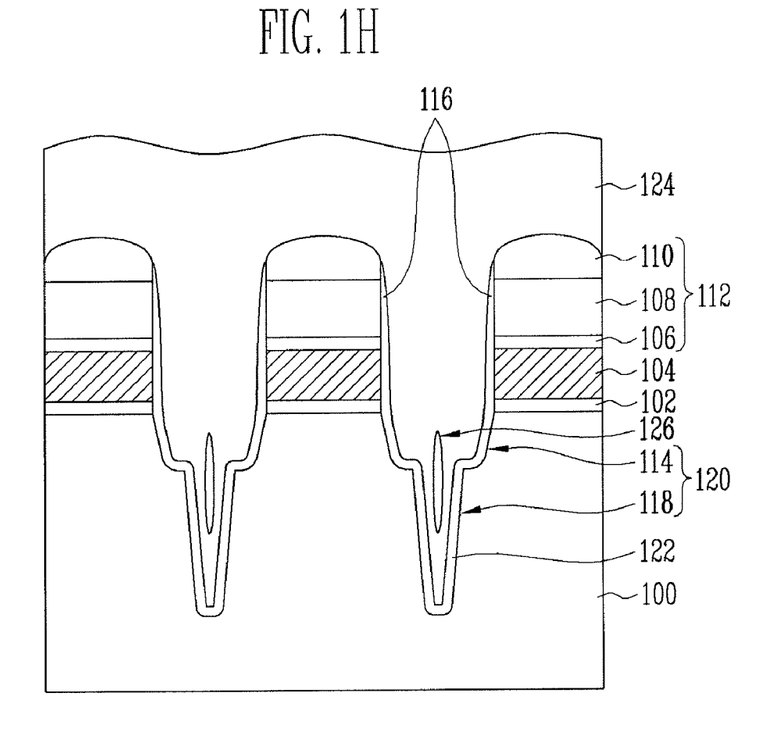

Referring to FIG. 1H, an insulating layer 124 is formed to fill the trenches 120. An isolation layer is formed when the insulating layer 124 is formed over the isolation region. The insulating layer 124 may be formed using Silicon-on Glass (SOG), High Density Plasma (HDP) oxide, $O_3$-Tetraethyl Orthosilicate (TEOS), Plasma Enhanced (PE) oxide or a mixed layer thereof.

In the process of forming the insulating layer 124 using films, a dry etch process or a wet etch process may be implemented in order to improve the gap-fill characteristic of the insulating layer 124. After the insulating layer 124 is formed, an annealing process may be performed in order to improve the film quality of the insulating layer 124.

The first trenches 114 and the second trenches 118 are filled with the insulating layer 124. The second trenches 118 are formed deeper in the surface of the semiconductor substrate 100 relative to the first trenches 114, and therefore have a narrower width than the first trenches 114. Thus, the second trenches 118 are not fully filled with the insulating layer 124, and a void 126 is formed in each second trench 118.

The voids 126 are formed within the trenches 120 at a location that is lower than a surface of the semiconductor substrate 100. The voids 126 do not influence subsequent processes. A relatively small amount of the insulating layer 124 is deposited in the second trenches 118 due to the voids 126.

The existence of the voids 126 causes the impact of extension stress or compression stress on the insulating layer 124 from the semiconductor substrate 100 to be decreased. Furthermore, as stress decreases, the mobility of impurities or ions injected into the semiconductor substrate 100 in a subsequent process is increased, thereby improving current characteristics.

Though not illustrated in the drawings, a CMP process or a blanket etch-back process is performed so that the insulating layer 124 remains only on the trenches 120 of the isolation region. In other words, the insulating layer 124 of an active region is removed.

As described above, after the second trenches are formed, the oxidization process is performed so that the sidewalls and the bottom surfaces of the second trenches are oxidized to a specific thickness. However, the oxidization process may be performed such that the second trenches are filled with an oxide layer.

Figure 2A:
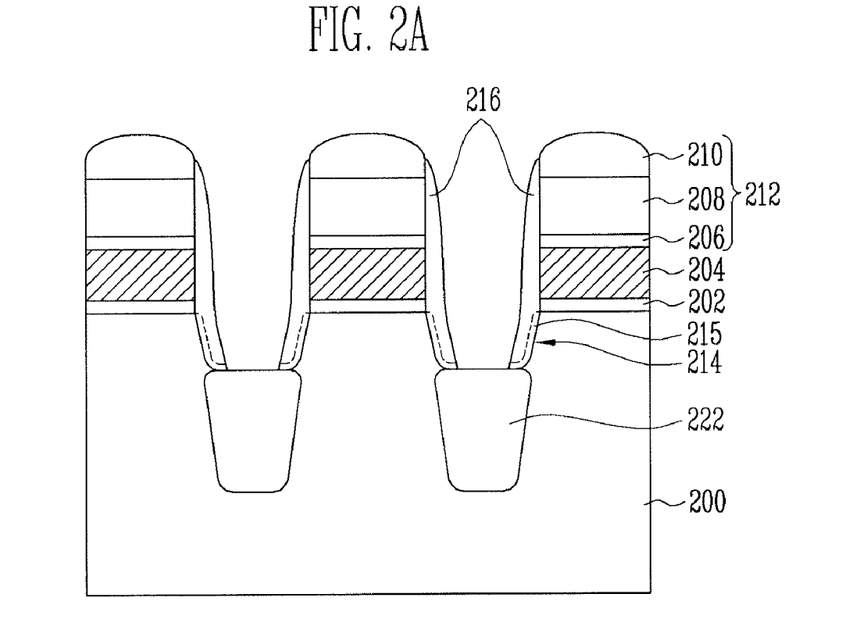
FIGS. 2A and 2B are cross-sectional views illustrating a method of forming an isolation layer of a semiconductor device according to another embodiment of the present invention.
Figure 2B:
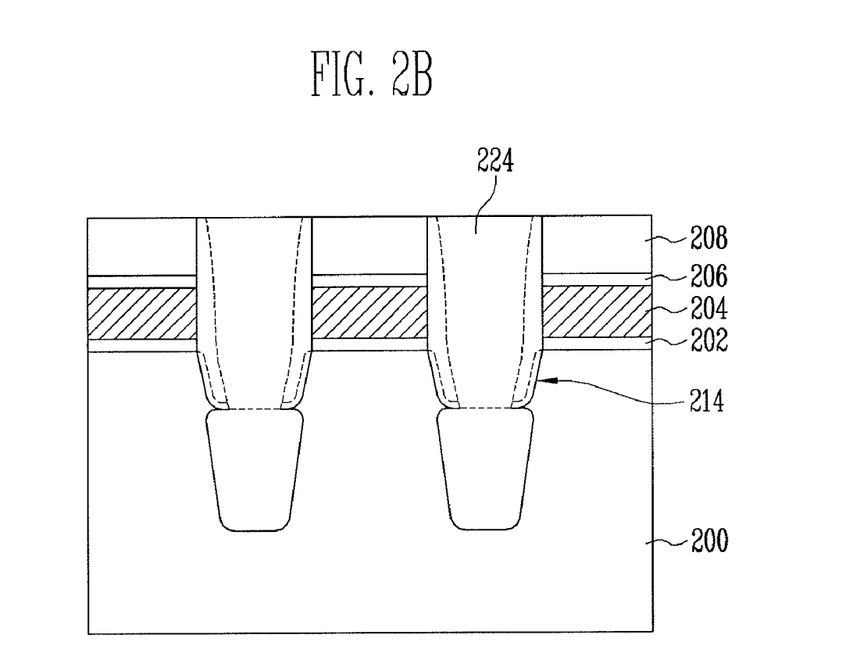
Figure 3:
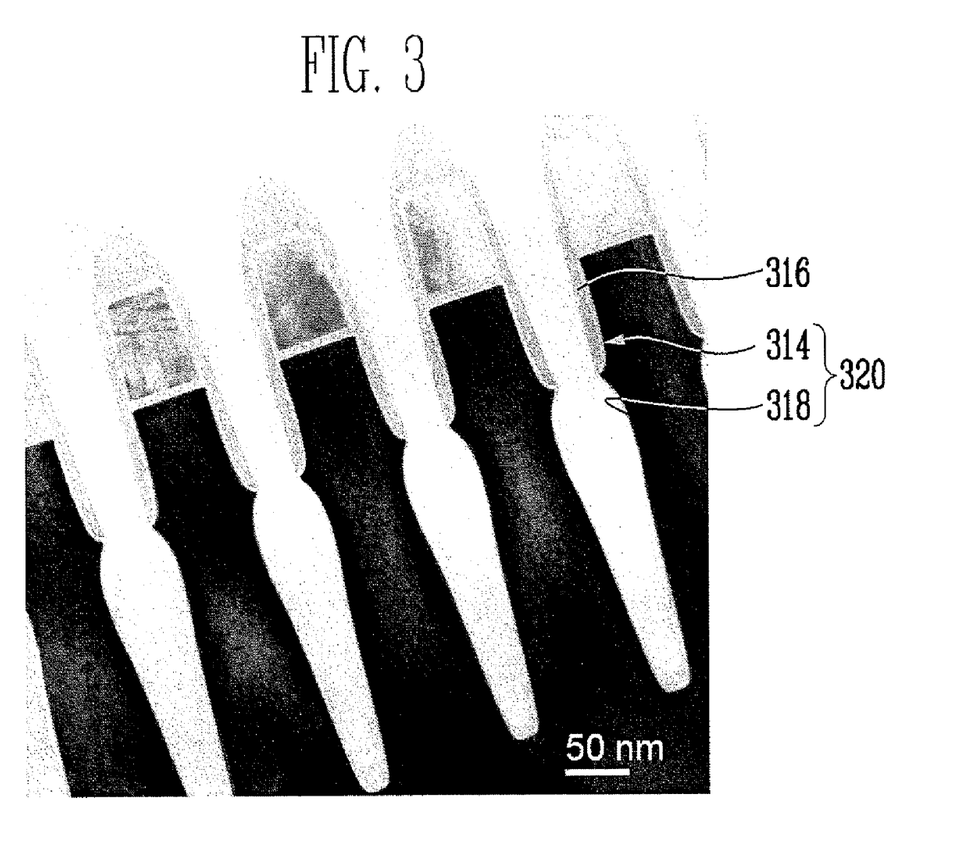
FIG. 3 is a TEM photograph showing the formation of trenches when forming an isolation layer of a semiconductor device according to an embodiment of the present invention.

FIGS. 2A and 2B are cross-sectional views illustrating a method of forming an isolation layer of a semiconductor device according to another embodiment of the present invention. FIG. 3 is a TEM photograph showing the formation of trenches when forming an isolation layer of a semiconductor device according to an embodiment of the present invention.

Referring to FIG. 2A, first trenches are formed by an etch process employing a spacer 216 and an isolation mask 212. However, when forming second trenches by an etch process such that the second trenches are more narrow than the first trenches, the second trenches may be formed with a jar-shape, as illustrated in FIG. 3.

In FIG. 3, reference numeral 316 denotes a spacer, 314 denotes a first trench, 318 denotes a second trench and 320 denotes a trench that includes the first trench 314 and the second trench 318. If the second trenches 318 are formed with a jar-shape, it is difficult to fill the second trenches 318 with an insulating material by depositing the insulating material.

As illustrated in FIG. 2A, a thermal oxidization process is performed so that the second trenches are filled with the insulating material (i.e., the second trenches are filled with a thermal oxide layer 222). The thermal oxide layer 222 is formed on sidewalls and bottom surfaces of the second trenches. The second trenches are filled with the thermal oxide layer 222 when the thermal oxide layer 222 is brought in contact with an oxide layer on the sidewalls.

If the thermal oxide layer 222 is formed after contacting an oxide layer on the sidewalls, stress may be applied to the substrate. Thus, the thermal oxidization process may be halted before the thermal oxide layer 222 contacts the oxide layer. A seam (not shown) may therefore be formed within the thermal oxide layer 222. The seam (if existent) is formed only within the second trenches, and therefore does not effect subsequent processes.

When the thermal oxidization process is performed to fill the second trenches with the thermal oxide layer 222, the spacer 216 serves as an oxidization-prevention layer to prevent the occurrence of the bird's beak when the edges of the tunnel insulating layer 202 are oxidized. If the thickness of the spacer 226 is too thin, the spacer cannot sufficiently serve as the oxidization-prevention layer. It is thus preferred that the etch process of the spacer 116 (as shown in FIG. 1F) be omitted.

Furthermore, when the second trenches are filled with the thermal oxide layer 222 by means of the thermal oxidization process, etch damage is repaired. Thus, the oxidization process illustrated in FIG. 1G may be omitted.

Referring to FIG. 2B, an insulating layer 224 is formed to fill the first trenches 214. The insulating layer 224 and the thermal oxide layer 222 formed in the isolation region become isolation layers. The insulating layer 224 may be formed using SOG, HDP oxide, $O_3$-TEOS, PE oxide or a mixed layer thereof. After the insulating layer 224 is formed, an annealing process may be performed to improve the film quality of the insulating layer 224.

As described above, according to the present invention, a trench having a wide upper portion and a relatively narrow lower portion is formed in an isolation region of a semiconductor substrate. The upper portion of the trench is filled with insulating material to form the isolation layer. A void is formed in the trench at a location lower than a surface of the substrate. Accordingly, the void does not effect subsequent processes, the impact of stress applied to the substrate may be decreased in portions in which the void is formed, and the mobility of ions injected into the substrate may be improved. Furthermore, the void does not influence subsequent processes.

The isolation layer may be formed using an insulating material, such as HDP oxide, without using SOG. Since an insulating material containing a lot of impurities, such as SOG, cannot be used as described above, a reduction in an electrical characteristic of the tunnel insulating layer due to the impurities may be prevented. Accordingly, a variation in threshold voltages may be minimized and the reliability of data storage may be improved.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A method of forming an isolation layer of a semiconductor device, the method comprising:
   forming first trenches in an isolation region of a semiconductor substrate;
   oxidizing sidewalls and a bottom surface of each of the first trenches by a radical oxidization process to form a first oxide layer;
   forming an oxidization-prevention spacer on the sidewalls of each of the first trenches in which the first oxide layer is formed;
   forming second trenches in the isolation region below the corresponding first trenches, wherein each second trench is narrower and deeper than the corresponding first trench;
   filling the second trenches with a second oxide layer on condition that the first oxide layer and the oxidation-prevention spacers remain on the sidewalls of the first trenches; and
   filling the first trenches with an insulating layer.

2. The method of claim 1, wherein each first trench is formed at a depth of approximately ⅙ to approximately ⅓ of a total depth of the first trench and the corresponding second trench.

3. The method of claim 1, further comprising etching each oxidization-prevention spacer so that a distance between opposite sides of the oxidization-prevention spacer is widened, wherein the etching is performed after the second trenches are formed.

4. The method of claim 1, further comprising removing the oxidization-prevention spacers after the second trenches are formed.

5. The method of claim 1, wherein the second oxide layer is formed using a thermal oxidization process.

6. The method of claim 1, wherein the insulating layer is formed of Silicon-on Glass (SOG), High Density Plasma (HDP) oxide, Plasma Enhanced (PE) oxide, $O_3$-Tetraethyl Orthosilicate (TEOS), or a combination thereof.

7. The method of claim 1, further comprising etching the insulating layer so that the insulating layer remains in the isolation region.

8. A method of forming an isolation layer of a semiconductor device, the method comprising:
   forming a tunnel insulating layer, an electronic storage layer and an isolation mask over a semiconductor substrate;
   etching the isolation mask, the electronic storage layer, the tunnel insulating layer and the semiconductor substrate of an isolation region to form first trenches;
   oxidizing sidewalls and a bottom surface of each of the first trenches by a radical oxidization process to form a first oxide layer;
   forming oxidization-prevention spacers on the sidewalls of the first trenches in which the first oxide layer is formed, the electronic storage layer and the isolation mask;
   forming second trenches in the isolation region below the first trenches, wherein each second trench is narrower and deeper than the corresponding first trench, wherein the second trenches are formed using the oxidation prevention spacers as a mask;
   filling the second trenches with a second oxide layer on condition that the first oxide layer and the oxidation-prevention spacers remain on the sidewalls of the first trenches; and
   filling the first trenches with an insulating layer.

9. The method of claim 8, wherein the electronic storage layer is formed of a silicon nitride layer.

10. The method of claim 8, wherein the isolation mask has a stack structure comprising a buffer oxide layer, a nitride layer and a hard mask.

11. The method of claim 8, wherein each first trench is formed at a depth of approximately 1/6 to approximately 1/3 of a total depth of the first trench and the corresponding second trench.

12. The method of claim 8, further comprising etching the oxidization-prevention spacers so that a distance between opposite sides of each oxidization-prevention spacer is widened, wherein the etching is performed after the second trenches are formed.

13. The method of claim 8, further comprising removing the oxidization-prevention spacers after the second trenches are formed.

14. The method of claim 8, wherein the second oxide layer is formed using a thermal oxidization process.

15. The method of claim 8, wherein the insulating layer is formed of Silicon-on Glass (SOG), High Density Plasma (HDP) oxide, Plasma Enhanced (PE) oxide, $O_3$-Tetraethyl Orthosilicate (TEOS), or any combination thereof.

16. The method of claim 8, further comprising etching the insulating layer so that the insulating layer remains in the isolation region.

* * * * *